United States Patent
Chen et al.

(10) Patent No.: US 10,468,117 B2
(45) Date of Patent: Nov. 5, 2019

(54) READ THRESHOLD ADJUSTMENT WITH FEEDBACK INFORMATION FROM ERROR RECOVERY

(71) Applicant: SanDisk Technologies LLC, Plano, TX (US)

(72) Inventors: Xiaoheng Chen, Milpitas, CA (US); Wei Wang, Milpitas, CA (US); Jingfeng Yuan, Milpitas, CA (US); Jeffrey L. Whaley, Milpitas, CA (US)

(73) Assignee: SanDisk Technologies LLC, Plano, TX (US)

( * ) Notice: Subject to any disclaimer, the term of this patent is extended or adjusted under 35 U.S.C. 154(b) by 196 days.

(21) Appl. No.: 15/404,870

(22) Filed: Jan. 12, 2017

(65) Prior Publication Data

US 2018/0197619 A1    Jul. 12, 2018

(51) Int. Cl.
*G11C 29/00* (2006.01)
*G11C 29/50* (2006.01)
*G11C 16/26* (2006.01)
*G11C 16/34* (2006.01)
*G11C 16/10* (2006.01)
G11C 16/04 (2006.01)

(52) U.S. Cl.
CPC ........ *G11C 29/50004* (2013.01); *G11C 16/10* (2013.01); *G11C 16/26* (2013.01); *G11C 16/3495* (2013.01); *G11C 16/0483* (2013.01); *G11C 2029/5004* (2013.01)

(58) Field of Classification Search
CPC ......... G11C 29/50; G11C 16/04; G11C 16/16; G11C 16/34; G11C 11/5628; G11C 11/5642; G11C 16/10; G11C 16/26; G11C 16/3495; G11C 29/021; G11C 29/028; G11C 29/42; G11C 29/50004; G11C 16/0483; G11C 2029/5004
USPC .......................... 714/718, 721, 763, 770, 773
See application file for complete search history.

(56) References Cited

U.S. PATENT DOCUMENTS

| | | | |
|---|---|---|---|
| 8,830,746 B2 * | 9/2014 | Barkon | G11C 11/5642 365/185.03 |
| 2011/0182119 A1 * | 7/2011 | Strasser | G11C 16/28 365/185.03 |
| 2012/0084490 A1 * | 4/2012 | Choi | G11C 16/02 711/103 |
| 2012/0203951 A1 * | 8/2012 | Wood | G11C 16/28 711/102 |
| 2013/0080858 A1 * | 3/2013 | Lee | G11C 16/26 714/773 |

(Continued)

*Primary Examiner* — Albert Decady
*Assistant Examiner* — Osman M Alshack
(74) *Attorney, Agent, or Firm* — Dickinson Wright PLLC

(57) ABSTRACT

A storage device with a memory may optimize the setting of a read threshold or read level. A feedback mechanism may be used responsive to there being a read retry error for providing the read threshold from the read retry. Specifically, recovery from a read failure can provide feedback information for dynamically optimizing read threshold values. Read threshold adjustments may occur each time there is a successful error recovery. The read threshold adjustment scheme may select one logical page or multiple logical pages from a recovered region. If a read threshold is found to be working, this threshold may be part of a feedback message to make an informed adjustment that optimizes the read threshold of other pages.

20 Claims, 10 Drawing Sheets

(56) References Cited

U.S. PATENT DOCUMENTS

| | | | | |
|---|---|---|---|---|
| 2013/0159785 A1* | 6/2013 | Hashimoto | ........... | G06F 11/004 |
| | | | | 714/47.2 |
| 2014/0101519 A1* | 4/2014 | Lee | ................ | G06F 11/1068 |
| | | | | 714/773 |
| 2014/0153330 A1* | 6/2014 | Yoon | ............... | G11C 11/5642 |
| | | | | 365/185.03 |
| 2014/0355340 A1* | 12/2014 | Sharon | ............... | G11C 16/26 |
| | | | | 365/185.03 |
| 2015/0179284 A1* | 6/2015 | Alrod | ............... | G06F 11/076 |
| | | | | 714/704 |
| 2016/0247576 A1* | 8/2016 | Park | .................. | G11C 16/26 |

* cited by examiner

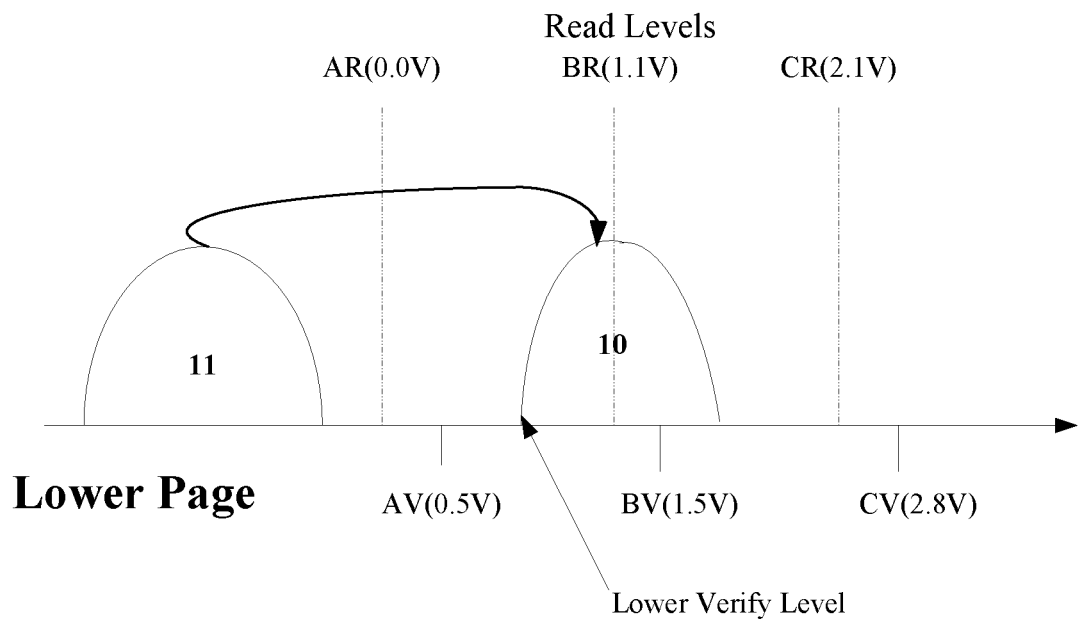
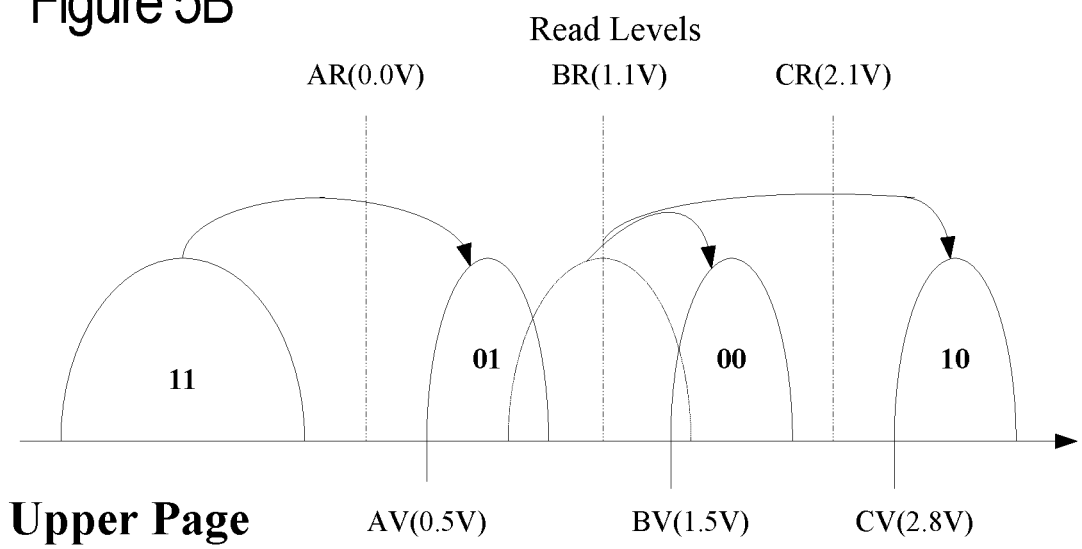

READ THRESHOLD ADJUSTMENT WITH FEEDBACK INFORMATION FROM ERROR RECOVERY

TECHNICAL FIELD

This application relates generally to memory devices. More specifically, this application relates to dynamically optimizing the setting of the read threshold based on feedback from read retry errors.

BACKGROUND

Non-volatile memory systems, such as flash memory, have been widely adopted for use in consumer products. Flash memory may be found in different forms, for example in the form of a portable memory card that can be carried between host devices or as a solid state disk (SSD) embedded in a host device. NAND is one example of a non-volatile flash memory. Flash memory may have a limited endurance, which determines a number of times a particular memory can be erased and re-programmed. As the non-volatile memory cell scales to smaller dimensions with higher capacity per unit area, the cell endurance due to program and erase cycling, and disturbances (e.g. due to either read or program) may become more prominent. The overall vulnerability of memory cells and the defect level during the silicon process may become elevated as the cell dimension shrinks and process complexity increases, which directly affects the data integrity at both the memory and system. Likewise, time and temperature may hinder data retention (DR) in a memory device. Increased time and/or temperature may cause a device to wear more quickly and/or lose data (i.e., data retention loss). Errors, such as those caused by retention loss, must be corrected, and the memory must attempt to prevent future errors. Read retry and adjustments of read thresholds may be one way to prevent errors. Adjustments to the read thresholds are typically in small increments, which hinders the ability to optimize the read thresholds.

SUMMARY

A storage device with a memory may optimize the setting of a read threshold or read level. A feedback mechanism may be used when there is a read retry error for providing the read threshold from the read retry. Specifically, recovery from a read failure can provide feedback information for dynamically optimizing read threshold values. Read threshold adjustments may occur each time there is a successful error recovery. The read threshold adjustment scheme may select one logical page or multiple logical pages from a recovered region. If a read threshold is found to be working, this threshold may be part of a feedback message to make an informed adjustment that optimizes the read threshold of other pages.

BRIEF DESCRIPTION OF THE DRAWINGS

FIG. 5A is a diagram illustrating charge levels in a multi-level cell memory operated to store two bits of data in a memory cell.
FIG. 5B is a diagram illustrating charge levels in a multi-level cell memory operated to store two bits of data in a memory cell.

DESCRIPTION OF THE EMBODIMENTS

Figure 1A:
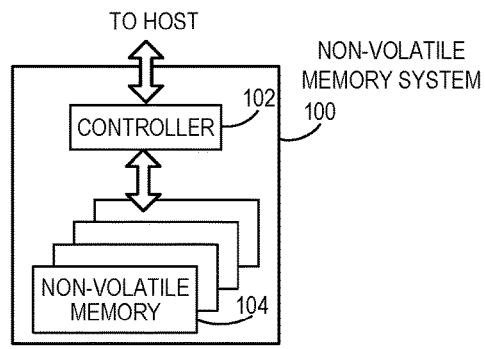
FIG. 1A is a block diagram of an example non-volatile memory system.

A storage device with a memory may optimize the setting of a read threshold or read level. A feedback mechanism may be used when there is a read retry error for dynamically providing the read threshold from the read retry. Specifically, recovery from a read failure can provide feedback information for dynamically optimizing read threshold values. The feedback information includes one or more candidate voltages that can be used as the read threshold value. This dynamic optimization may be referred to as Decision Assist Read Threshold adjustment ("DART"). DART candidate voltages start with the voltage level that is recovered from read failures but then a range around that value can be used. The optimal read threshold value is likely to be within that range around the recovered voltage number.

Read retry errors results in more latency from a customer perspective. The device and memory operations are slower. Read retry errors result in at least one extra read operation for each error. Read retry and adjustments of read thresholds may be one way to prevent or reduce errors, which may be caused by data retention ("DR") problems or wear. Data retention errors may be due to the state overlaps or upper state shift (e.g. FIGS. 5A-7C), and may refer to either a gain or loss of charge over time. Data may be lost if the charge gain/loss passes over a threshold voltage which then changes the value of the cell. Data loss (i.e. poor data retention) results in a gradual shift of the distribution. Wear on the memory may cause the width and shape of the charge distributions to change. An erase cycle may reset the charge for the cells in a block, which can correct the gain/loss of charge over time.

Read retry precisely measures the threshold voltage of cells after programming. Read retry may allow a user to change the read reference voltage (i.e. read threshold or read threshold values) that separates the cell levels. After cycling, a memory cell has a higher rate of data or read threshold loss; therefore, more read margin is needed to read the different states after data retention—the more cycles, the more threshold loss. The read retry feature has different read threshold settings for each option that move the read state and enable the read algorithm to keep these states readable. When the read threshold values create errors, then read retry can be used to offer adjustments to those read threshold values. In one embodiment, read retry is initiated when an error bit number (i.e. bit error rate) is over capability of the ECC correction limit.

Read retry can be used to read out the threshold voltage of the programmed cells. In particular, read retry may include testing different read threshold voltages to identify an appropriate read threshold voltage in view of charge distribution changes. The different read retry voltage tests may be referred to as read retry cases, which are stored in a read retry table. Upon initiation of read retry, the memory may have to try several of the read retry cases from the read retry table until a read retry case is identified that includes read threshold voltages that correct the errors. The more read retry cases that are tested, the less efficient the memory may function. Accordingly, selecting an optimized read retry case more quickly improves memory efficiency and operation.

Read recovery operations may include an iteratively applied read retry case that is executed with specific read threshold voltages for that case. If that case is not successful, then a different read retry case is applied. This process continues with read retry cases from the read retry table until a read error is corrected. In one embodiment, Temporal Adaptive Read Threshold ("TART") may be used to adjust the read threshold. TART is a conventional read threshold adjustment scheme by which the read threshold or read levels are adjusted by small increments. The small increments for increasing or decreasing the read threshold may be referred to as the DAC or read threshold delta and may be incremented for each iteration. In one embodiment, the DAC increment or read threshold voltage delta is 25 millivolts (mV). Because the read threshold voltage delta is small, if the optimization is incorrect by a large margin, compensating for the correction can require numerous increments of the read threshold voltage delta. This is may be an inefficient and time consuming process. The DART mechanism described herein may utilize the read thresholds from read failures as a candidate set of read thresholds that are dynamically selected for optimizing the value of the read threshold rather than relying on the small increments in read threshold voltage from TART.

The read threshold value can be optimized for data retention ("DR") or read disturb ("RD"). DR was discussed above and read disturb ("RD") errors may be caused when cells in a memory block change over time (e.g. become programmed unintentionally). It may be due to a particular cell being excessively read which may cause the read disturb error for neighboring cells. In particular, a cell that is not being read, but receives elevated voltage stress because a neighboring cell is being read. Charge may collect on floating gates, which may cause a cell to appear to be programmed. In alternative embodiments, the memory may not use floating gates. For example, 3D memory may be a charge trap rather than a floating gate. The read disturb error may result in a data loss. Error Correction Code ("ECC") may correct the error and an erase cycle can reset the programming of the cell.

The optimization for DR may be in an opposite direction of an optimization for RD. As a result, blocks optimized for DR may have a higher rate of error for blocks that have RD issues. Specifically, if 99% of the blocks are DR impacted and 1% of the blocks are impacted by RD, then applying the DR optimization to the RD impacted blocks may result in a very high retry rate. The read retry rate decreases when RD optimization is applied to RD impacted blocks, but increases when DR optimization is applied to those RD impacted blocks. Likewise, the read retry rate decreases when DR optimization is applied to DR impacted blocks, but increases when RD optimization is applied to those DR impacted blocks. Accordingly, an optimization for multiple types of blocks may not be an optimization unless it is done dynamically and individually. As discussed below, the read thresholds may be set dynamically for blocks or meta-blocks or other units of the memory to improve the optimization. Specifically, memory blocks or units may be organized and optimized dynamically with multiple read thresholds to avoid causing a high retry rate for different types of blocks (DR vs. RD blocks). The dynamic nature of the optimization takes feedback information and corrects the read threshold to minimize the retry rate.

FIGS. 1A-2B are exemplary memory systems which may implement read threshold optimization using DART. FIG. 1A is a block diagram illustrating a non-volatile memory system. The non-volatile memory system 100 includes a controller 102 and non-volatile memory that may be made up of one or more non-volatile memory die 104. As used herein, the term die refers to the set of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104. The non-volatile memory die 104 may store an operating system for the host.

Examples of host systems include, but are not limited to, personal computers (PCs), such as desktop or laptop and other portable computers, tablets, mobile devices, cellular telephones, smartphones, personal digital assistants (PDAs), gaming devices, digital still cameras, digital movie cameras, and portable media players. For portable memory card applications, a host may include a built-in receptacle for one or more types of memory cards or flash drives, or a host may require adapters into which a memory card is plugged. The memory system may include its own memory controller and drivers but there may also be some memory-only systems that are instead controlled by software executed by the host to which the memory is connected. In some memory systems containing the controller, especially those embedded within a host, the memory, controller and drivers are often formed on a single integrated circuit chip. The host may communicate with the memory card using any communication protocol such as but not limited to Secure Digital (SD) protocol, Memory Stick (MS) protocol and Universal Serial Bus (USB) protocol.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid state disk (SSD) drive installed in a personal computer.

Although in the example illustrated in FIG. 1A, non-volatile memory system 100 includes a single channel between controller 102 and non-volatile memory die 104, the subject matter described herein is not limited to having a single memory channel. For example, in some NAND memory system architectures, such as in FIGS. 1B and 1C, 2, 4, 8 or more NAND channels may exist between the controller and the NAND memory device, depending on controller capabilities. In any of the embodiments described herein, more than a single channel may exist between the controller and the memory die, even if a single channel is shown in the drawings.

Figure 1B:
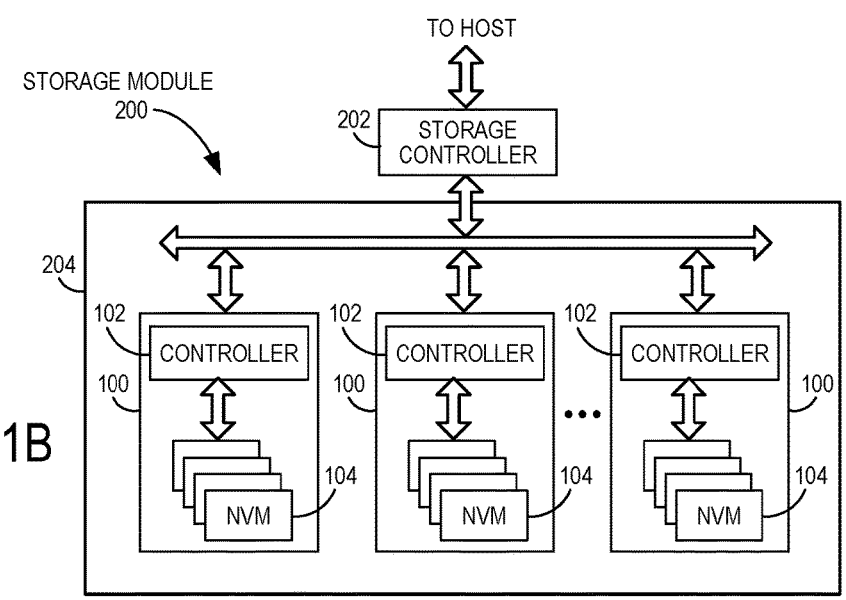
FIG. 1B is a block diagram of a storage module that includes a plurality of non-volatile memory systems.

FIG. 1B illustrates a storage module 200 that includes plural non-volatile memory systems 100. As such, storage module 200 may include a storage controller 202 that interfaces with a host and with storage system 204, which includes a plurality of non-volatile memory systems 100. The interface between storage controller 202 and non-volatile memory systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

Figure 1C:
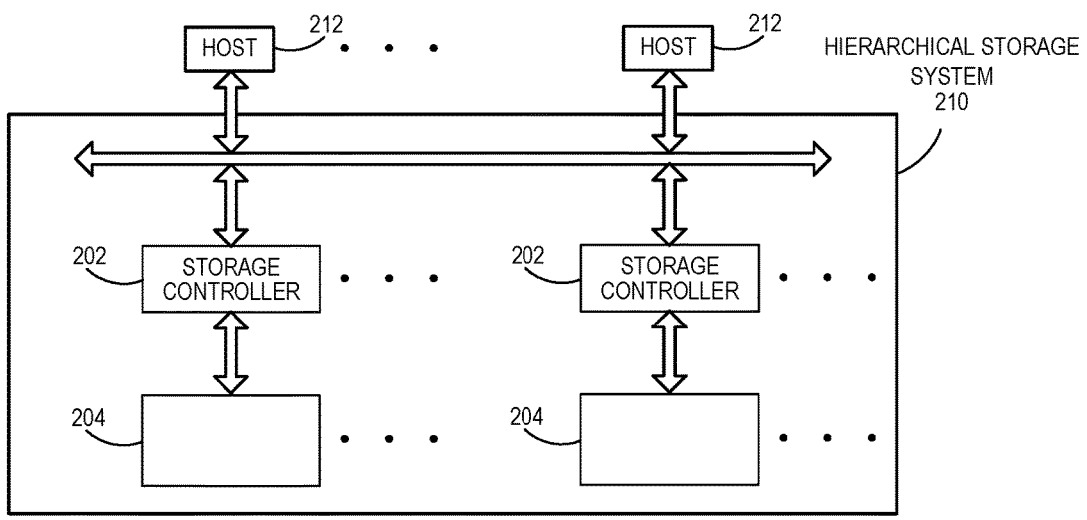
FIG. 1C is a block diagram of a hierarchical storage system.

FIG. 1C is a block diagram illustrating a hierarchical storage system. A hierarchical storage system 210 includes a plurality of storage controllers 202, each of which control a respective storage system 204. Host systems 212 may access memories within the hierarchical storage system via a bus interface. In one embodiment, the bus interface may be a non-volatile memory express (NVMe) or a fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
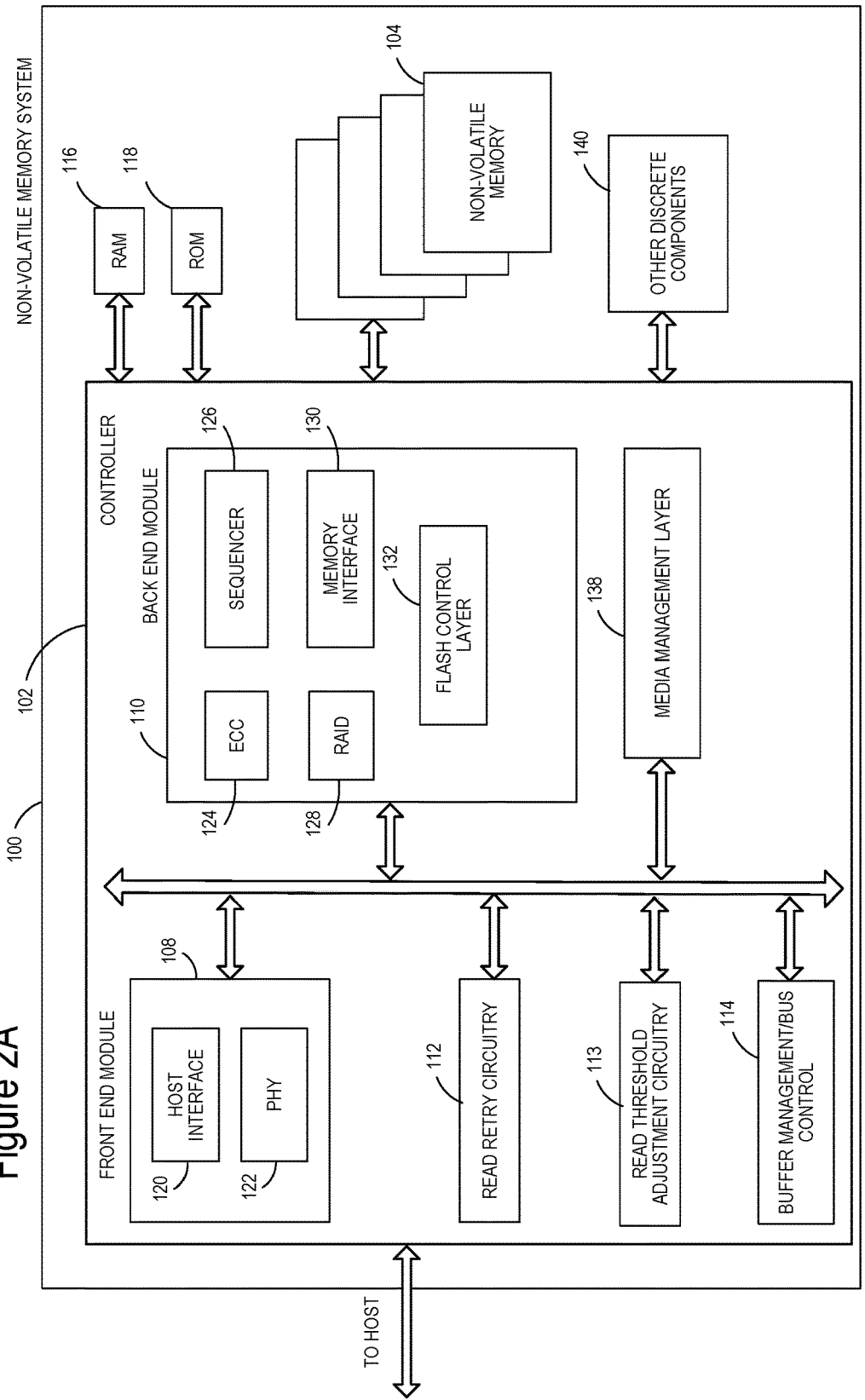
FIG. 2A is a block diagram of exemplary components of a controller of a non-volatile memory system.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform functions which will now be described in detail.

A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include memory hardware, such as a portion of the memory 104, for example, that comprises instructions executable with a processor to implement one or more of the features of the module. When any one of the modules includes the portion of the memory that comprises instructions executable with the processor, the module may or may not include the processor. In some examples, each module may just be the portion of the memory 104 or other physical memory that comprises instructions executable with the processor to implement the features of the corresponding module.

The controller 102 may include read retry circuitry 112 for performing read retry. The read retry operation is further discussed with respect to FIGS. 7-8. The controller 102 may include read threshold adjustment (aka DART) circuitry 113 for optimizing read threshold levels based on feedback from the read retry circuitry including the read thresholds from the read retry operations being used as candidate read threshold values for optimization. The read threshold optimization with read retry feedback is further described with respect to FIGS. 9-10.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller. Further, in some implementations, the controller 102, RAM 116, and ROM 118 may be located on separate semiconductor die.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

Additional components of system 100 illustrated in FIG. 2A include media management layer 138, which performs wear leveling of memory cells of non-volatile memory die 104. System 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

The FTL or MML 138 may be integrated as part of the flash management that may handle flash errors and interfacing with the host. In particular, MML may be a module in flash management and may be responsible for the internals of NAND management. In particular, the MML 138 may include an algorithm in the memory device firmware which translates writes from the host into writes to the flash memory 104. The MML 138 may be needed because: 1) the flash memory may have limited endurance; 2) the flash memory 104 may only be written in multiples of pages; and/or 3) the flash memory 104 may not be written unless it is erased as a block. The MML 138 understands these potential limitations of the flash memory 104 which may not be visible to the host. Accordingly, the MML 138 attempts to translate the writes from host into writes into the flash memory 104. As described below, erratic bits may be identified and recorded using the MML 138. This recording of erratic bits can be used for evaluating the health of blocks.

Figure 2B:
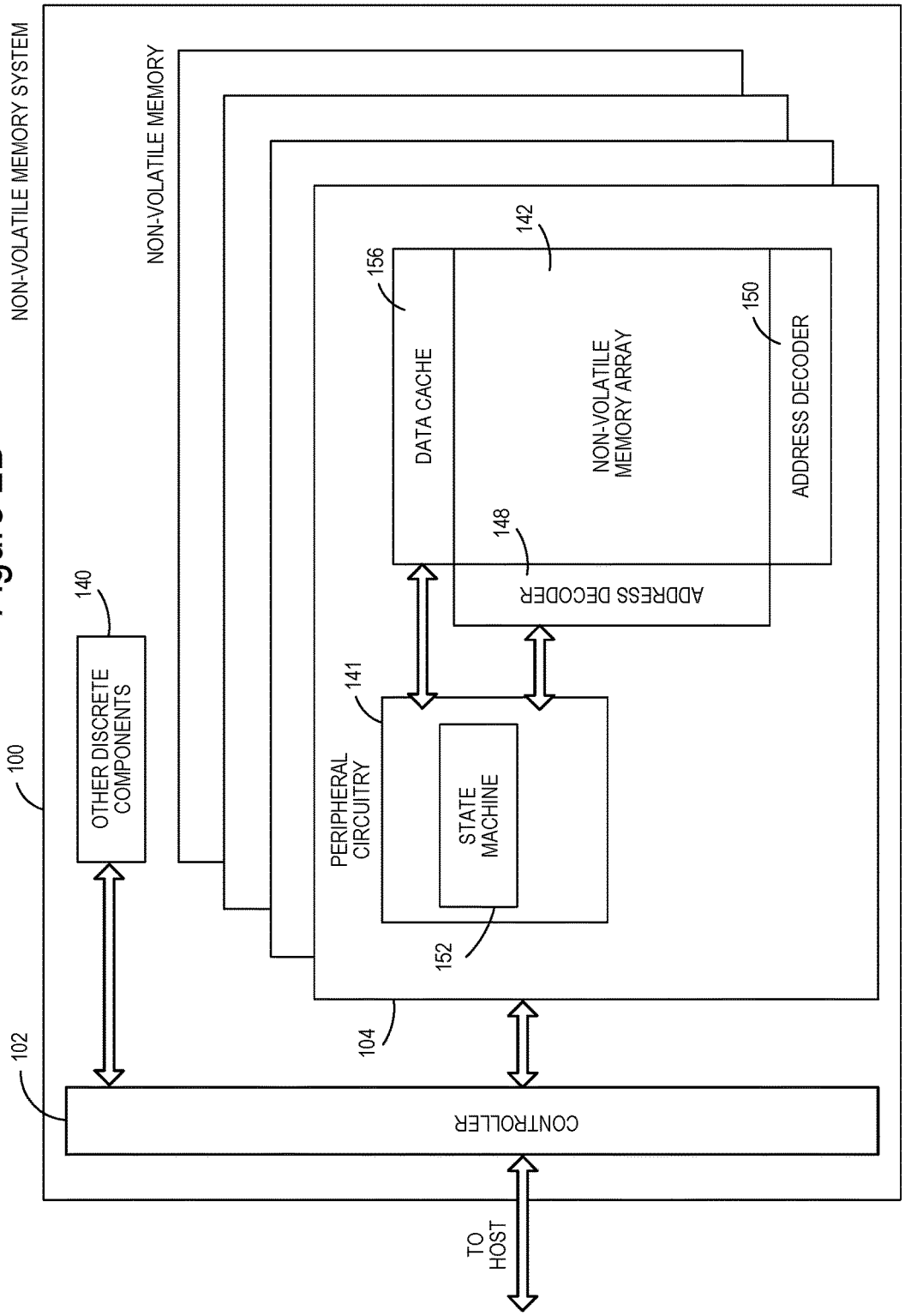
FIG. 2B is a block diagram of exemplary components of a non-volatile memory of a non-volatile memory storage system.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to controller 102. Non-volatile memory die 104 further includes a data cache 156 that caches data. Exemplary peripheral circuitry 141 may include clocks, pumps, ESD, current shunt, current sink, and/or closely-packed logic circuits.

Figure 3:
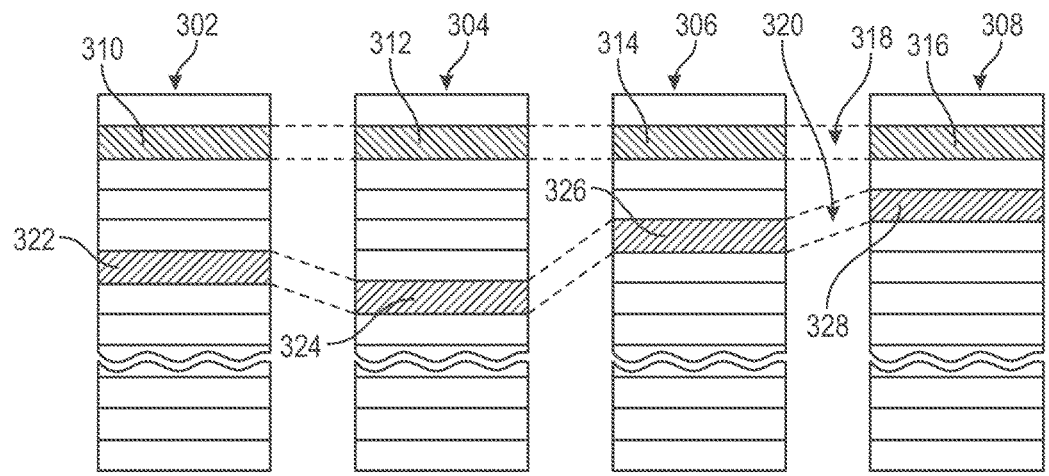
FIG. 3 is an example physical memory organization of the system of FIGS. 1A-2B.
Figure 4:
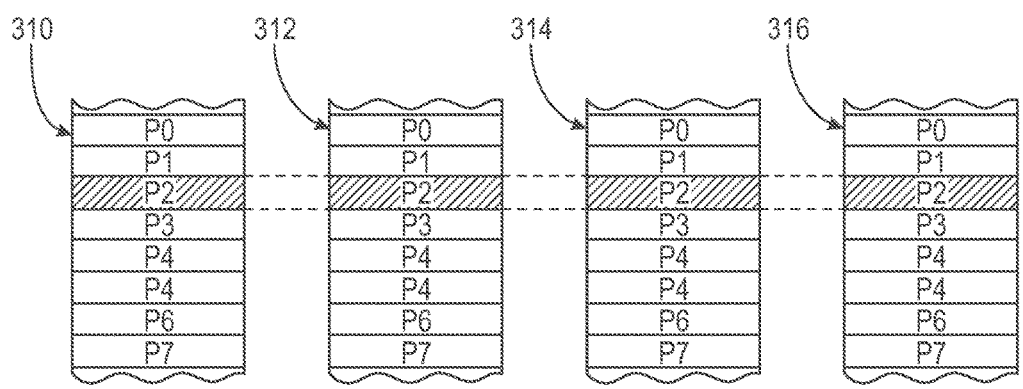
FIG. 4 is an expanded view of a portion of the physical memory of FIG. 3.

As described, the read threshold optimization may adjust read threshold levels based on feedback from read retry errors. The read threshold voltages may be applied to different levels of the memory (e.g. die, block, page, etc.). FIGS. 3-4 illustrate different groupings of memory that may be associated with a particular read threshold (e.g. metablocks).

FIG. 3 conceptually illustrates an organization of the flash memory 104 (FIGS. 1A-2B) as a cell array. The flash memory 104 may include multiple memory cell arrays which are each separately controlled by a single or multiple memory controllers 102. Four planes or sub-arrays 302, 304, 306, and 308 of memory cells may be on a single integrated memory cell chip, on two chips (two of the planes on each chip) or on four separate chips. Although, reconditioning may be described at the block level (e.g. reconditioning the memory block-by-block), the reconditioning may be at a different level (e.g. page level or meta-block level).

Other numbers of planes, such as 1, 2, 8, 16 or more may exist in a system. The planes may be individually divided into groups of memory cells that form the minimum unit of erase, hereinafter referred to as blocks. Blocks of memory cells are shown in FIG. 3 by rectangles, such as blocks 310, 312, 314, and 316, located in respective planes 302, 304, 306, and 308. There can be any number of blocks in each plane. The block of memory cells is the unit of erase, and the smallest number of memory cells that are physically erasable together. For increased parallelism, however, the blocks may be operated in larger metablock units or chunks. One block from each plane is logically linked together to form a metablock. The four blocks 310, 312, 314, and 316 are shown to form one metablock 318. All of the cells within a metablock are typically erased together. The blocks used to form a metablock need not be restricted to the same relative locations within their respective planes, as is shown in a second metablock 320 made up of blocks 322, 324, 326, and 328. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation. As described below, the meta-block may be created with planes from different dies. In other words, each meta-block includes planes from different dies.

The individual blocks may be divided for operational purposes into pages of memory cells, as illustrated in FIG. 4. The memory cells of each of the blocks 310, 312, 314, and 316, for example, are each divided into eight pages P0-P7. Alternatively, there may be 16, 32 or more pages of memory cells within each block. The page is the unit of data programming and reading within a block, containing the minimum amount of data that are programmed or read at one time. However, in order to increase the memory system operational parallelism, such pages within two or more blocks may be logically linked into metapages. A metapage 402 is illustrated in FIG. 3, being formed of one physical page from each of the four blocks 310, 312, 314, and 316. The metapage 402, for example, includes the page P2 in each of the four blocks but the pages of a metapage need not necessarily have the same relative position within each of the blocks. A metapage may be the maximum unit of programming.

The memory cells may be operated to store two levels of charge so that a single bit of data is stored in each cell. This is typically referred to as a binary or single level cell ("SLC") memory. SLC memory may store two states: 0 or 1. Alternatively, the memory cells may be operated to store more than two detectable levels of charge in each charge storage element or region, thereby to store more than one bit of data in each. This latter configuration is referred to as multi-level cell ("MLC") memory. For example, MLC memory may store four states and can retain two bits of data: 00 or 01 and 10 or 11. Both types of memory cells may be used in a memory, for example binary SLC flash memory may be used for caching data and MLC memory may be used for longer term storage. The charge storage elements of the memory cells described below may be a non-conductive dielectric charge trapping material.

Figure 6:
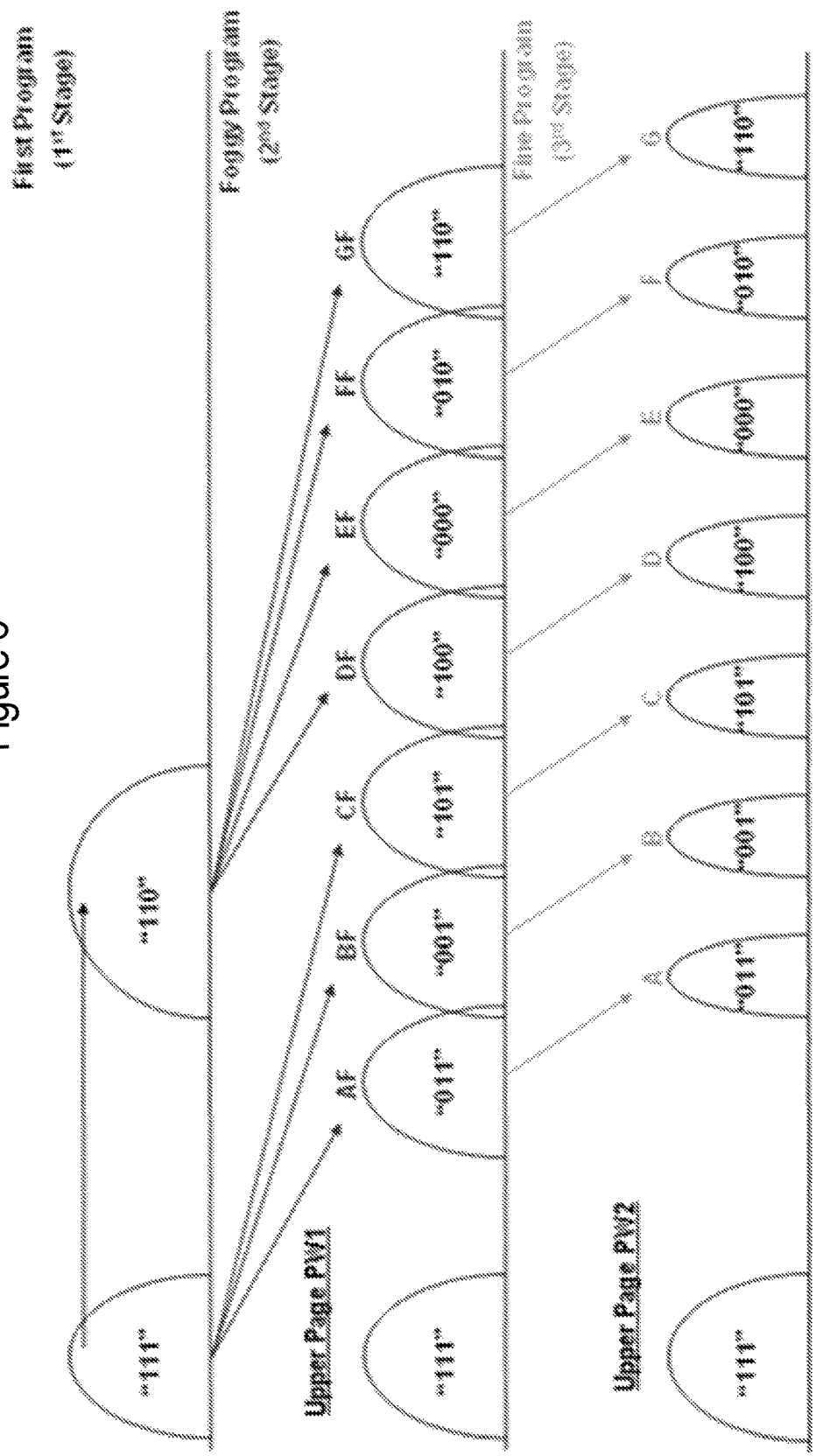
FIG. 6 is a diagram illustrating charge levels in a multi-level cell memory.

FIGS. 5A-5B are diagrams illustrating charge levels in cell memory. The charge storage elements of the memory cells are most commonly conductive floating gates but may alternatively be non-conductive dielectric charge trapping material. Each cell or memory unit may store a certain number of bits of data per cell. As shown in FIG. 5B, MLC memory may store four states and can retain two bits of data: 00 or 01 and 10 or 11. Alternatively, MLC memory may store eight states for retaining three bits of data as shown in FIG. 6. In other embodiments, there may be a different number of bits per cell.

FIG. 5B illustrates a memory cell that is operated to store two bits of data. This memory scheme may be referred to as eX2 memory because it has two bits per cell. FIG. 5B illustrates a two-bit per cell memory scheme in which four states (Erase, A, B, C). FIG. 5B illustrates one implementation of the four charge levels used to represent two bits of data in a memory cell. In implementations of MLC memory operated to store two bits of data in each memory cell, each memory cell is configured to store four levels of charge corresponding to values of "11," "01," "10," and "00." Each bit of the two bits of data may represent a page bit of a lower page or a page bit of an upper page, where the lower page and upper page span across a series of memory cells sharing a common word line. Typically, the less significant bit of the two bits of data represents a page bit of a lower page and the more significant bit of the two bits of data represents a page bit of an upper page. The read thresholds are established for identifying each state. The read threshold may be also referred to as a read threshold voltage, a read margin, a read level, or a read level voltage. The three read thresholds (AR, BR, CR) delineate the four states. Likewise, there is a verify level (i.e. a voltage level) for establishing the lower bound for programming each state. When the verify level overlaps with a read threshold, there may be a read error which necessitates read retry. As described, the read retry operation can be used to provide feedback regarding the setting of the read threshold.

FIG. 5A may be referred to as lower at middle (LM) mode or lower-middle intermediate state. The LM intermediate state may also be referred to as a lower page programmed stage as shown in FIG. 5A. The lower page is programmed first in FIG. 5A and then the upper page is programmed in FIG. 5B. A value of "11" corresponds to an un-programmed state or erase state of the memory cell. When programming pulses are applied to the memory cell to program a page bit of the lower page, the level of charge is increased to represent a value of "10" corresponding to a programmed state of the page bit of the lower page. The lower page may be considered a logical concept that represents a location on a multi-level cell (MLC). If the MLC is two bits per cell, a logical page may include all the least significant bits of the cells on the wordline that are grouped together. In other words, the lower page is the least significant bits. For a page bit of an upper page, when the page bit of the lower page is programmed (a value of "10"), programming pulses are applied to the memory cell for the page bit of the upper page to increase the level of charge to correspond to a value of "00" or "10" depending on the desired value of the page bit of the upper page. However, if the page bit of the lower page is not programmed such that the memory cell is in an un-programmed state (a value of "11"), applying programming pulses to the memory cell to program the page bit of the upper page increases the level of charge to represent a value of "01" corresponding to a programmed state of the page bit of the upper page.

FIG. 6 is a diagram illustrating charge levels in a multi-level cell memory operated to store three bits of data in a memory cell (i.e. eX3). FIG. 6 illustrates MLC memory with three bits of data which are stored in a single cell by establishing eight states or voltage level distinctions. FIG. 6 illustrates the stages that may be used for programming three bit memory. In a first stage, the voltage levels are divided out at two levels, and at the second stage (i.e. foggy program), those two levels are divided up into the eight states without setting the distinct levels between states. At the third stage (i.e. fine program), the voltage levels for each of the eight states are separated and distinct. The fine programming establishes the voltage levels for each of the states. As compared with two bit memory, the three bit memory in FIG. 6 requires more exact programming voltages to avoid errors. Likewise, the read threshold voltages may be smaller and more likely to be susceptible to cell voltage or charge level movement, from electron movement or loss. Accordingly, read threshold optimization may be necessary to reduce read errors. In alternative embodiments, there may be memory schemes with increased bits per cell (e.g. 4 bits per cell or X4 memory).

Figure 7A:
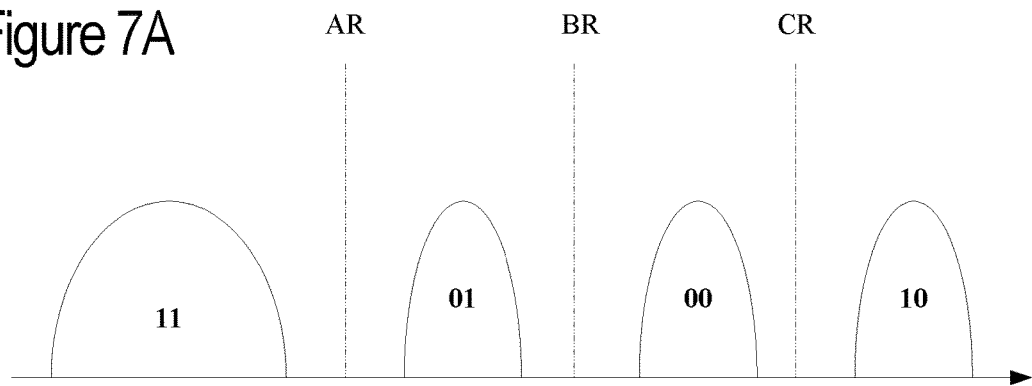
FIG. 7A illustrates the four charge levels used to represent two bits of data in a memory cell.
Figure 7B:
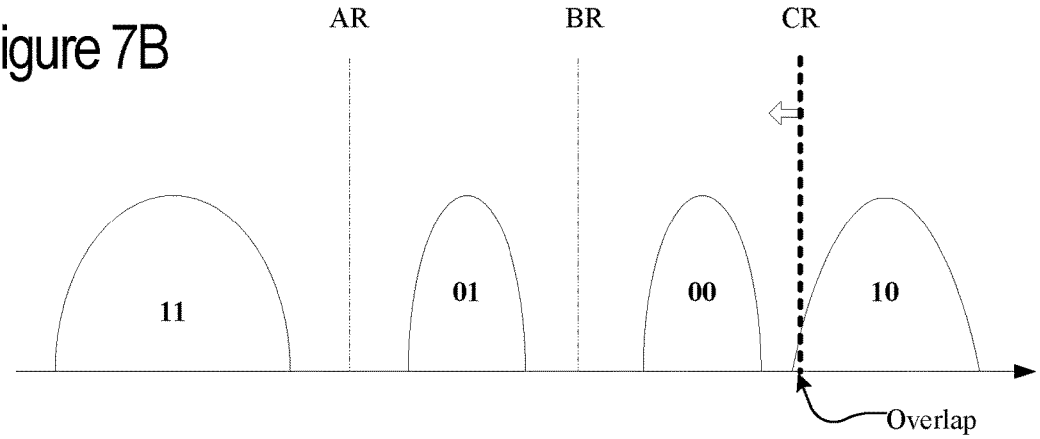
FIG. 7B illustrates a shifting charge distribution.
Figure 7C:
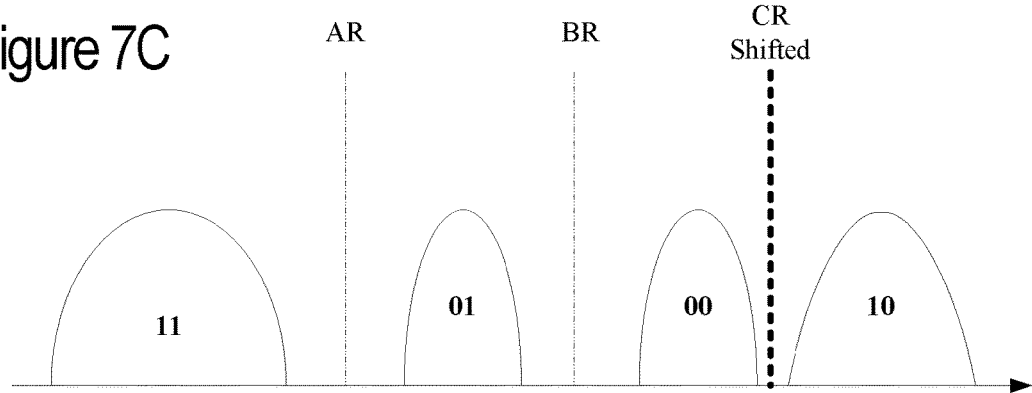
FIG. 7C illustrates adjustment of read levels as a result of charge level shifting.

Multi-level cell placements such as FIGS. 5A-5B or FIG. 6 can shift beyond the read threshold voltage, causing read errors. As long as the distributions are not overlapping, the data should be recoverable. FIGS. 7A-7C illustrate a shifting charge distribution that causes errors due to overlap with a read threshold value. In either the two bit memory system of FIGS. 5A-5B or the three bit memory system of FIG. 6, the charge distributions may shift or change resulting in problems with the read threshold. Although FIGS. 7A-7C illustrate two bit memory, it applies to other memory types (e.g. three bit memory shown in FIG. 6).

FIGS. 7A, 7B, and 7C illustrate adjustment of read thresholds as a result of charge level shifting. This may be one example of a read retry in which a shifted read threshold is used to correct a failed read operation. As described, the read threshold may be shifted to account for a read failure and that shifting during a read retry may be used as feedback for optimizing read threshold selection. FIG. 7A illustrates the four charge levels used to represent two bits of data in a memory cell, such as shown in FIG. 5B. This two bit MLC memory stores four levels of charge corresponding to values of 11, 01, 10, and 00. In one embodiment, the 11 state may be referred to as the erase state. While the 01, 00, and 10 states may be referred to as the A, B, and C states, respectively. FIG. 7A illustrates the read threshold voltage between each of the states (AR, BR, CR). The read voltage threshold may also be referred to as a sense voltage and is the voltage level that a read operation uses to distinguish between the states.

FIG. 7B illustrates a shifting charge distribution. Charge distributions can shift and distribution tails can enter the previously non-overlapping distribution margin regions, crossing the read threshold voltages. As a result, a cell that stored one logical value can be misread as storing a different logical value, which is described as a read error or bit error. FIG. 7B illustrates the 10 state (C state) shifting due to widening and crossing the read threshold voltage CR, which would cause read errors. As a result of the widening of the C state, there may be voltages that should be in the C state that have crossed the read threshold voltage (CR) and would be read as being in the B state. This overlap of a charge distribution with the read threshold voltage causes an error.

Read retry allows the read threshold voltages to be adjusted along with changes in charge distributions. The read retry case which utilizes this shift is considered a successful or working read retry case. Each read retry case in a read retry table includes a set of read threshold voltages that may or may not correct an error, such as the one shown in FIG. 7B. A read retry operation can modify the read threshold voltage (CR) in FIG. 7B to avoid overlap. FIG. 7C illustrates adjustment of read levels as a result of charge level shifting. Read retry shifts the read threshold voltage CR to the left to prevent overlap with the 10 C state. FIG. 7C illustrates that the shifting of the CR read threshold voltage would properly delineate the B and C states. Previously, the read threshold shifting may have been performed by a read voltage delta value that increments the read threshold slightly; however, the optimization described herein includes using successful read threshold values in a candidate set of read threshold values that can be used rather than gradually incrementing the read threshold during read retry until the overlap was eliminated.

Figure 8:
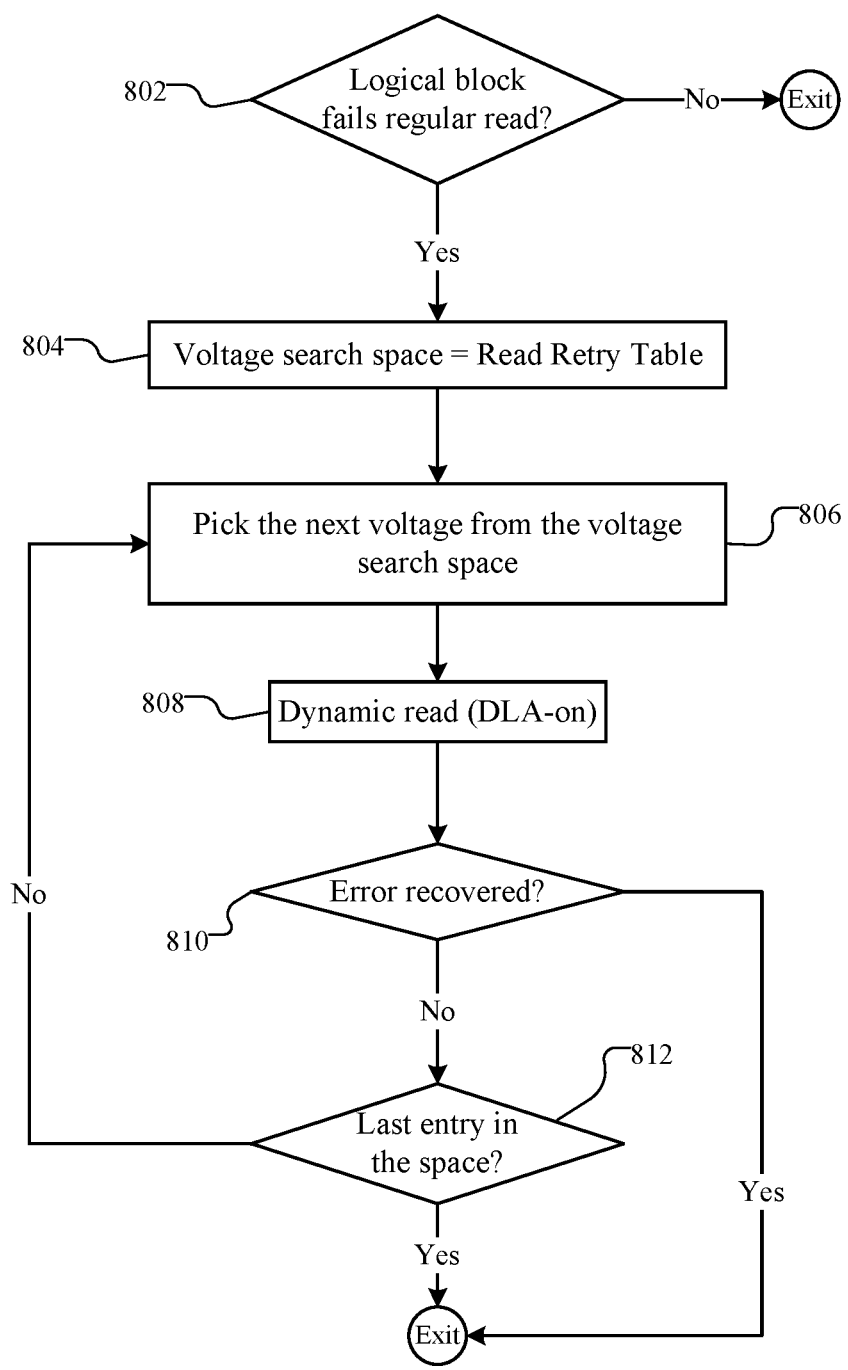
FIG. 8 illustrates a read retry process.

FIG. 8 is a flowchart illustrating read retry. In block 802, a logical block may fail regular read, such as with a read error. If there is no failure, then there is no read retry. If there is a read failure, then the voltage search space relies on the read retry table for the read threshold in block 804. A voltage is selected in block 806 from the voltage search space. Dynamic read is turned on in block 810. Dynamic read (also referred to as DLA-on) is a slower read designed to reduce the failed bit count. Regular read (DLA-off) is a faster read but with a higher error rate than dynamic read. Dynamic read is a dynamic changing of the read threshold. For example, the read level may start at read level A and if it fails, read level B is tried. If read level B fails, then read level C is tried. This dynamic changing of the read level is referred to as dynamic read (DLA-on).

When an error is recovered in block 810, the read retry stops. The read threshold voltage that recovers from the error may be included in the read retry table. When the error is not recovered in block 810, a check is made of the voltage search space. If there are no more entries in the voltage search space of block 812, the read retry ends. If there are more entries in the voltage search space of block 812, then the next voltage from the voltage search space is picked from block 806 and the read retry continues using that next voltage.

Dynamic read with DLA-on may be used to recover a regular read failure. The DART scheme will seek read threshold adjustments each time there is a successful error recovery. If error recovery flow can recover the current read failure using dynamic read (DLA-on hard read), the algorithm for the scheme will exploit the read threshold that results in successful recovery to find a read threshold that can work for regular read (DLA-off hard read). The DART scheme will select one logical page or multiple logical pages from the recovered region and try to decode it using regular read (DLA-off) mode with selected read thresholds neighboring the read level that works for dynamic read (DLA-on hard read). If one read threshold is found to be working for regular read (DLA-off), the DART scheme may stop the search process and generate a feedback message to make an informed adjustment that optimizes the read threshold. If no such read threshold is found, then the per-die read threshold will not be adjusted.

In one example, a 32K die page or 16K plane page (physical page on NAND) may include 8 or 4 logical pages (4K size each). The layout may be:
LP=> logical page
|=> logical page boundary/divider
Plane page layout: LP0|LP1|LP2|LP3
Die page laytout: LP0|LP1|LP2|LP3|LP4|LP5|LP6|LP7

When only one logical page goes to recovery, e.g., LP0, it can be decoded using regular read mode. However, when multiple LPs on the same plane/die page go to recovery, e.g., LP0 and LP1, all of the LPs may be selected and decoded using regular read mode. In other words, all of the other LPs are considered neighboring.

A per-die read level change is allowed when all the LPs in the recovered region can be recovered using regular read and just one read level. An alternative includes picking a subset of the LPs going to recovery, e.g., LP0 also applies. Alternatively, a superset of the LPs going to recovery, e.g., every LP on the plane/die page may be selected using the same algorithm.

In another embodiment, neighboring may further include (for lower page) a −8/−4 is selected and implementation may have any offset relative to the read level found by DLA-on hard read, e.g., −1/−2/−3/1/2/3; BR−8, BR−4, BR, BR+4, BR+8. In another embodiment (for upper page), the arbitrary read level combinations using the neighboring read levels to the current read level found by DLA-on hard read may include (for upper page),
(AR−4, CR+4), (AR−4, CR), . . . .
AR=> A read level
BR=> B read level
CR=> C read level
AR and CR determines the upper pages read results and BR determines the lower page read results.

Figure 9:
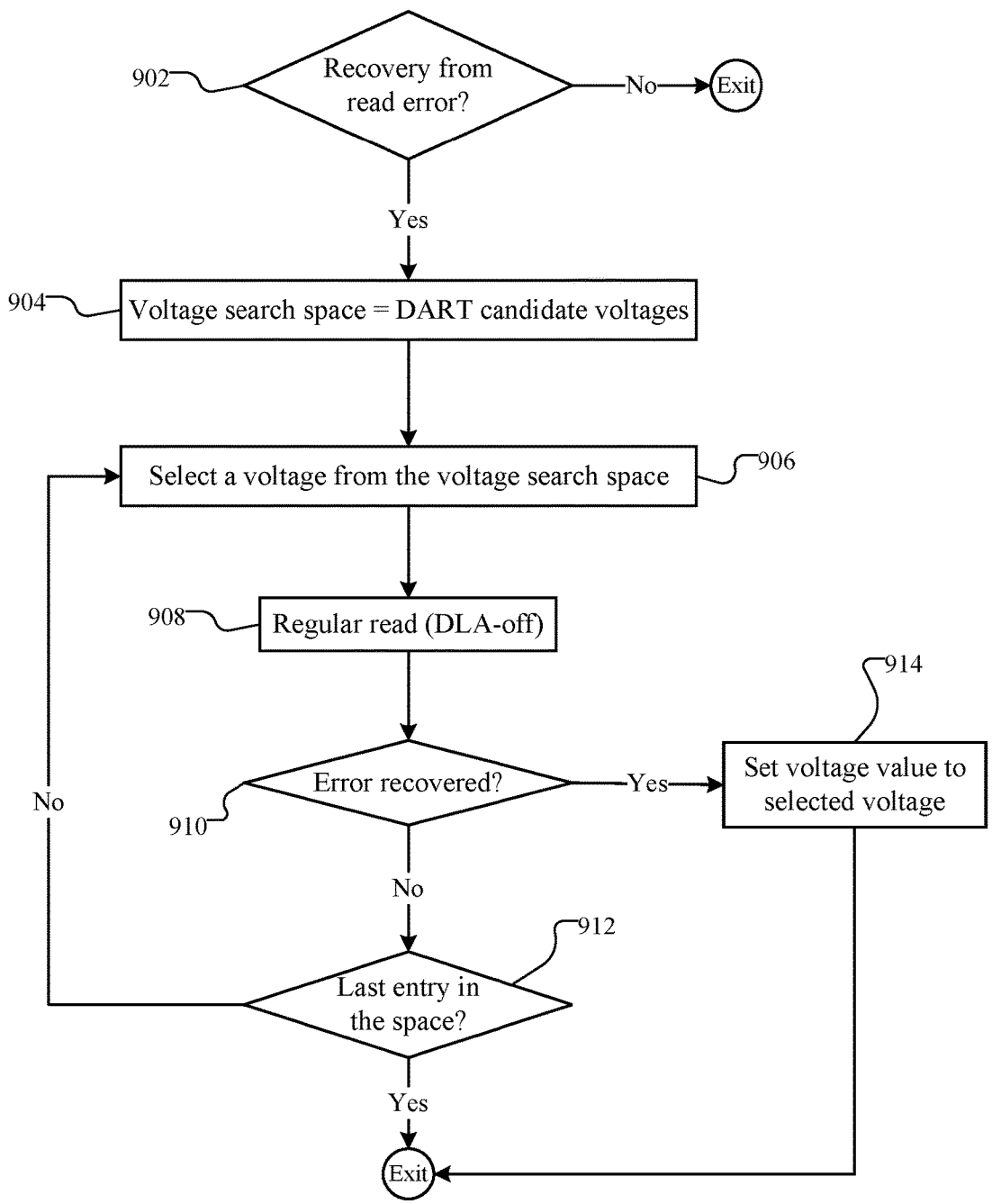
FIG. 9 illustrates dynamic read threshold adjustment using read error feedback.

FIG. 9 illustrates dynamic read threshold adjustment using read error feedback. In block 902, if a recovery from a read error has not occurred, then the read threshold adjusting will not proceed. However, if there is a recovery from a read error in block 902, then the voltage search space can include DART candidate voltages in block 904. A voltage is selected from the voltage search space in block 906. The candidate voltages may include read threshold values used for recovery from a read error along with a range around that value. Candidate voltages may include the most probable voltages that may lead to successful error recovery using DLA-OFF hard read. For example, the voltage found by DLA-on hard read is typically included along with the neighboring read level (as explained above) of the voltage found by DLA-on hard read, and the read level found using other mechanism (for example, TART).

A regular read (DLA-off) occurs in block 908. When an error is not recovered in block 910, a check is performed as to whether the selected voltage is the last entry in the voltage search space in block 912. If there are more entries in the voltage search space of block 912, the read threshold adjustment ends. If there are more entries in the voltage search space of block 912, then the next voltage from the voltage search space is picked from block 906 and the read threshold adjustment continues using that next voltage. In block 910, if there is an error recovered, then the voltage value is set to be the selected voltage in block 914. In other words, the read error recovery is used to provide that read threshold as feedback information for optimizing the resetting of the read threshold. The read threshold that is being adjusted is applied to the per-die read level. The region is re-read causing regular read to fail with candidate voltages to make sure the updated read level can cause a successful read.

The pseudo code reflecting the FIG. 9 flowchart is shown as follows:

```
def dart_lower( ):
    if flow_success_by_dla1_hard_read:
        vts = [flow_br + offset for offset in offsets]
        vts.insert(tart_br)
        for vt in vts:
            if dla0_hard_read(vt): # if error recovered
                die_br = vt
```

This pseudo code is for the lower page. The br is the read threshold of the lower page, while ar is the read threshold of the upper page. This corresponds with the A, B, and C states discussed with respect to FIGS. 5A-7.

This read threshold adjustment may be different on each die of the memory. The read threshold may be set for individual blocks, meta-blocks, pages, meta-pages, or other memory groupings as discussed with respect to FIGS. 3-4. In one embodiment, this adjustment scheme may be combined with a traditional or conventional read threshold adjustment scheme. For example, the TART adjustment scheme may be combined with this DART adjustment scheme as described with respect to FIG. 10.

Figure 10:
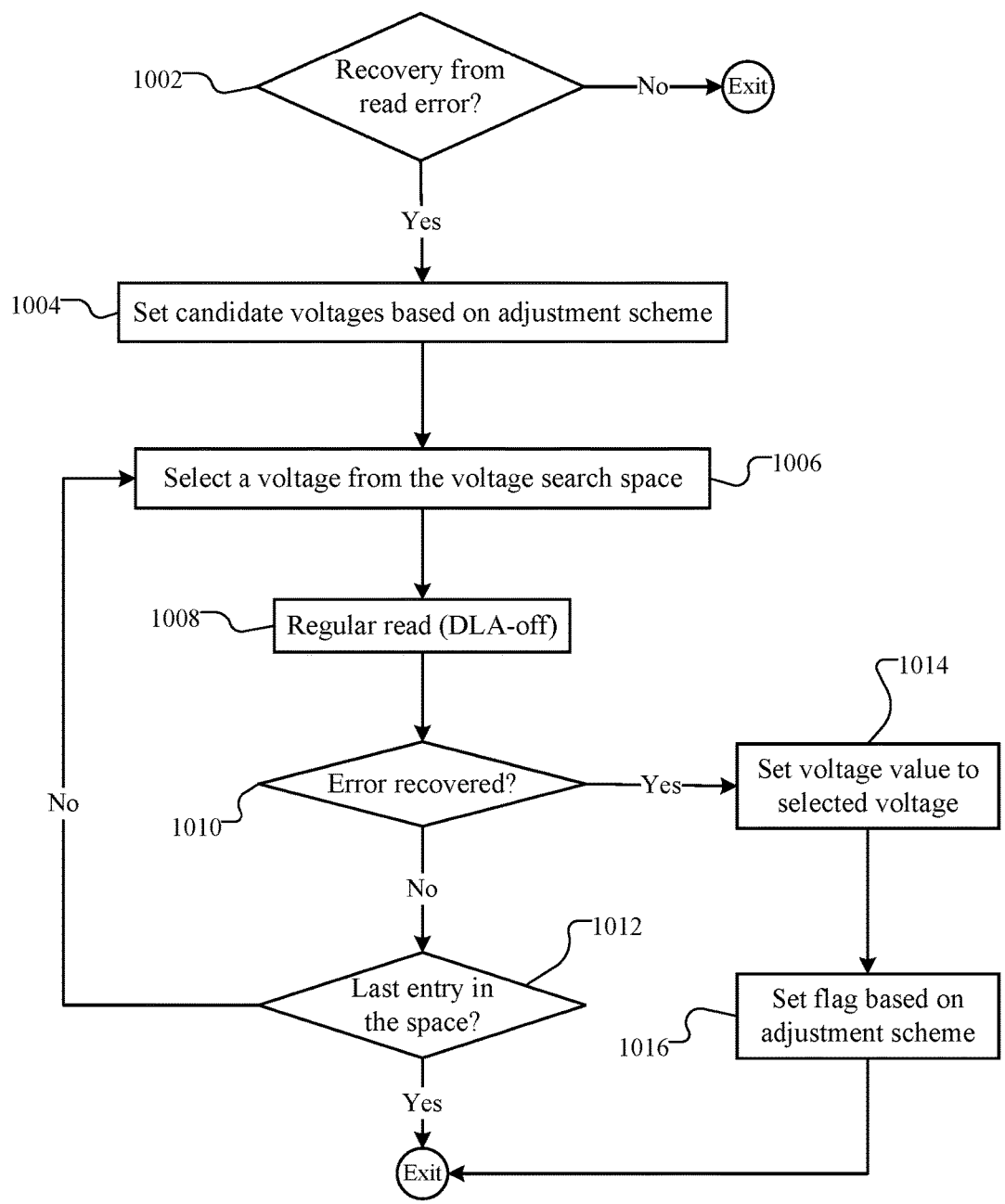
FIG. 10 illustrates dynamic read threshold adjustment scheme using read retry feedback along with a conventional adjustment scheme.

FIG. 10 illustrates dynamic read threshold adjustment scheme using read retry feedback along with a conventional adjustment scheme. In block 1002, if a recovery from a read error has not occurred, then the read threshold adjusting will not proceed. However, if there is a recovery from a read error in block 1002, then the voltage search space voltage candidates are selected based on the adjustment scheme. As discussed above, the DART adjustment scheme uses feedback information from the recovery of read errors, but the TART adjustment scheme may also be used. A voltage is selected from the voltage search space in block 1006. A regular read (DLA-off) occurs in block 1008. When an error is not recovered in block 1010, a check is performed as to whether the selected voltage is the last entry in the voltage search space in block 1012. If there are more entries in the voltage search space of block 1012, the read threshold adjustment ends. If there are more entries in the voltage search space of block 1012, then the next voltage from the voltage search space is picked from block 1006 and the read threshold adjustment continues using that next voltage. In block 1010, if there is an error recovered, then the voltage value is set to be the selected voltage in block 1014. Then there may be a flag that is set based on the type of adjustment scheme in block 1016. For example, was the selected voltage a TART voltage or a DART voltage. The flag can be used to track the current read threshold.

The pseudo source code for FIG. 10 on a lower page is:

```
def dart_lower( ):
    if flow_success_by_dla1_hard_read:
```

```
        if die_br_src == 'tart':
            vts = [flow_br + offset for offset in offsets]
        else:
            vts = [flow_br + offset for offset in offsets]
            vts.insert(tart_br)
        for vt in vts:
            if dla0_hard_read(vt): # if error recoverred
                die_br = vt
                if vt == tart_br:
                    die_br_src = 'tart'
                else:
                    die_br_src = 'dart'
```

The pseudo source code for FIG. 10 on an upper page is:

```
def dart_upper( ):
    if flow_success_by_dla1_hard_read:
        if die_upper_src == 'tart':
            vts = [(flow_ar + offset[0], flow_cr + offset[1])
                for offset in offsets]
        else:
            vts = [(flow_ar + offset[0], flow_cr + offset[1])
                for offset in offsets]
            vts.insert((tart_ar, tart_cr))
        for vt in vts:
            if dla0_hard_read(vt): # if error recoverred
                die_ar, die_cr = vt
                if vt == (tart_ar, tart_cr):
                    die_upper_src = 'tart'
                else:
                    die_upper_src = 'dart'
```

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column.

The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

In the present application, semiconductor memory devices such as those described in the present application may include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magneto-resistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

A "computer-readable medium," "machine readable medium," "propagated-signal" medium, and/or "signal-bearing medium" may comprise any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM", a Read-Only Memory "ROM", an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed. The processed medium may then be stored in a computer and/or machine memory. In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

It is intended that the foregoing detailed description be understood as an illustration of selected forms that the invention can take and not as a definition of the invention. It is only the following claims, including all equivalents that are intended to define the scope of the claimed invention. Finally, it should be noted that any aspect of any of the preferred embodiments described herein can be used alone or in combination with one another.

We claim:

1. A method for read threshold adjustment comprising:
   identifying a read threshold used for recovery from a read error;
   retrieving, by a controller from a memory associated with the controller, a candidate set of voltages;
   utilizing the identified read threshold for the candidate set of voltages, wherein the candidate set of voltages includes at least one voltage value used to recover the read error and one or more voltage values within a range of the at least one voltage value used to recover the read error, and wherein the one or more voltage values include voltage values corresponding to a successful read error recovery using a dynamic hard read operation;
   selecting a logical memory group whose read threshold is adjustable; and
   selecting a voltage from the candidate set of voltages to test for a read error recovery at the logical memory group using the selected voltage as the logical memory group read threshold.

2. The method of claim 1 wherein the test comprises determining whether a regular read operation using the selected voltage as the read threshold causes an error.

3. The method of claim 1 wherein the test comprises determining whether a dynamic read operation using the selected voltage as the read threshold causes an error.

4. The method of claim 1 further comprising:
   resetting the read threshold of the logical memory group to the selected voltage responsive to there being a read error recovery from the test.

5. The method of claim 1 further comprising:
   selecting, responsive to the selected voltage not resulting in an error recovery, another voltage from the candidate set of voltages.

6. The method of claim 5 further comprising:
   testing the another voltage for a read error recovery at the logical memory group using the another voltage as the logical memory group read threshold.

7. The method of claim 6 further comprising:
   resetting the read threshold of the logical memory group to the another voltage responsive to there being a read error recovery from the testing.

8. The method of claim 1 wherein the logical memory group is a neighboring memory group to a logical memory group utilizing the identified read threshold.

9. The method of claim 8 wherein the logical memory group comprises a block or metablock.

10. The method of claim 8 wherein the logical memory group comprises a page or metapage.

11. The method of claim 1 wherein the recovery comprises a read retry operation.

12. The method of claim 11 wherein the read threshold comprises a voltage at which charge distributions are distinguished.

13. A storage device comprising:
    read retry circuitry configured to initiate a read retry operation by:
      retrieving, from a memory associated with the storage device, a selected read retry case;
      shifting a read threshold according to the selected read retry case, wherein the selected read retry case includes a set of read threshold voltages that includes at least one read threshold voltage value used to recover a read error and one or more read threshold voltage values within a range of the at least one read threshold voltage value used to recover the read error, and wherein the one or more read threshold voltage values include voltage values corresponding to a successful read error recovery using a dynamic hard read operation; and
      testing the shifted read threshold to identify a read threshold that recovers from a read error; and
    read threshold adjustment circuitry configured to adjust a read threshold by:
      setting another read threshold to be the identified read threshold; and
      testing the another read threshold for read error recovery.

14. The storage device of claim 13 further comprising:
    a memory comprising memory blocks; and
    a controller coupled with the memory that is configured to access the read retry circuitry and initiate the read retry operation.

15. The storage device of claim 13 wherein the read retry circuitry is further configured for:
    selecting the selected read retry case from a read retry table;
    updating the read retry table with the identified read threshold.

16. The storage device of claim 13 wherein the adjustment of the read threshold is made to the another read threshold responsive to the read error recovery occurring for the testing of the another read threshold.

17. The storage device of claim 13 wherein:
    the read retry operation is for a first logical memory group;
    the read threshold adjustment circuitry adjusts a read threshold for a second logical memory group; and
    the second logical memory group is adjacent to the first logical memory group.

18. A memory system comprising:
    means for determining recovery from a read error;
    means for retrieving, by a controller associated with the memory system, a candidate set of voltages stored in a memory associated with the memory system;

means for selecting a voltage from the candidate set of voltages, wherein the candidate set of voltages includes at least one voltage value used to recover the read error and one or more voltage values within a range of the at least one voltage value used to recover the read error, and wherein the one or more voltage values include voltage values corresponding to a successful read error recovery using a dynamic hard read operation; and means for optimizing a read threshold value based on the selected voltage from the candidate set.

19. The system of claim 18 wherein the optimizing comprises trying different ones of the candidate set of voltages to identify which of the candidates results in error recovery when set as the read threshold.

20. The system of claim 18 wherein the optimizing is for a neighboring logical memory group to a logical memory group from the determined recovery.

* * * * *